United States Patent
Selvidge et al.

(10) Patent No.: US 10,410,713 B1
(45) Date of Patent: Sep. 10, 2019

(54) CONTENT ADDRESSABLE MEMORY MODELING IN EMULATION AND PROTOTYPING

(71) Applicant: Mentor Graphics Corporation, Wilsonville, OR (US)

(72) Inventors: Charles W. Selvidge, Oakland, CA (US); Sanjay Gupta, Noida (IN); Krishnamurthy Suresh, Noida (IN); Praveen Shukla, Noida (IN); Saurabh Gupta, Noida (IN)

(73) Assignee: Mentor Graphics Corporation, Wilsonville, OR (US)

(*) Notice: Subject to any disclaimer, the term of this patent is extended or adjusted under 35 U.S.C. 154(b) by 56 days.

(21) Appl. No.: 15/724,262

(22) Filed: Oct. 3, 2017

Related U.S. Application Data

(60) Provisional application No. 62/404,008, filed on Oct. 4, 2016.

(51) Int. Cl.
| | | |
|---|---|---|
| *G11C 15/04* | (2006.01) | |
| *G11C 11/409* | (2006.01) | |
| *G06F 17/50* | (2006.01) | |
| *G11C 29/04* | (2006.01) | |
| *G06F 9/455* | (2018.01) | |

(52) U.S. Cl.
CPC ........ *G11C 11/409* (2013.01); *G06F 17/5027* (2013.01); *G06F 2009/45583* (2013.01); *G11C 2029/0401* (2013.01)

(58) Field of Classification Search
CPC .................................. G11C 15/04; G11C 15/00
USPC ....................................................... 365/49.17
See application file for complete search history.

(56) References Cited

U.S. PATENT DOCUMENTS

| | | | | |
|---|---|---|---|---|
| 6,122,710 A | * | 9/2000 | Kumar ................ | G06F 12/0862 711/118 |
| 2014/0278329 A1 | * | 9/2014 | Selvidge ............. | G06F 17/5027 703/15 |
| 2015/0006808 A1 | * | 1/2015 | Miller .................... | G11C 15/00 711/108 |
| 2018/0247694 A1 | * | 8/2018 | Wickeraad ............. | G11C 15/00 |

* cited by examiner

*Primary Examiner* — Hoai V Ho

(57) ABSTRACT

Aspects of the disclosed technology relate to techniques for modeling content-addressable memory in emulation and prototyping. A model for content-addressable memory comprises memory circuitry configured to store match results for various search keys. The match results are stored in the second memory circuitry during write operations. The model for content-addressable memory may further comprise additional memory circuitry configured to operate as a standard computer memory, performing read operations alone and write operations along with the memory circuitry.

30 Claims, 9 Drawing Sheets

Flow chart 700

Flow chart 700

CONTENT ADDRESSABLE MEMORY MODELING IN EMULATION AND PROTOTYPING

RELATED APPLICATIONS

This application claims the benefit of U.S. Provisional Patent Application No. 62/404,008, filed on Oct. 4, 2016, and naming Charles W. Selvidge et al. as inventors, which application is incorporated entirely herein by reference.

FIELD OF THE DISCLOSED TECHNOLOGY

The present disclosed technology relates to the field of circuit design verification technology. Various implementations of the disclosed technology may be particularly useful for verifying circuit designs that have content addressable memory devices.

BACKGROUND OF THE DISCLOSED TECHNOLOGY

Modern integrated circuit designs have become extremely complex. As a result, various techniques have been developed to verify that circuit designs will operate as desired before they are implemented in an expensive manufacturing process. For example, logic simulation is a tool used for verifying the logical correctness of a hardware design. Designing hardware today involves writing a program in the hardware description language. A simulation may be performed by running that program. If the program runs correctly, then one can be reasonably assured that the logic of the design is correct at least for the cases tested in the simulation.

Software-based simulation, however, may be too slow for large complex designs such as SoC (System-on-Chip) designs. The speed of execution of a simulator drops significantly as the design size increases due to cache misses and memory swapping. Emulation and prototyping significantly increase verification productivity by employing reconfigurable hardware modeling devices including emulators and prototyping devices. Field programmable gate arrays (FPGAs)-based emulators and prototyping devices rely on an actual silicon implementation and perform circuit verification generally in parallel as the circuit design will execute in a real device. By contrast, a simulator performs circuit verification by executing the hardware description code serially. The different styles of execution can lead to orders of magnitude differences in execution time.

While reconfigurable hardware modeling device-based emulation and prototyping are much faster than simulation for system-on-chip designs, verifying circuit designs that have content-addressable memory devices remains a challenge. Content-addressable memory (CAM), a special type of computer memory, is often used in certain high-speed searching applications. When a networking switch, for example, receives a data frame from one of its ports, it updates an internal table with the frame's source MAC address (media access control address) and the port it was received on. The internal table is implemented with a binary CAM. The networking switch then looks up the destination MAC address in the table to determine what port the frame needs to be forwarded to, and sends it out on that port.

Unlike standard computer memory (random access memory or RAM) in which the user supplies a memory address and the RAM returns the data word stored at that address, CAM is designed such that the user supplies a data word and the CAM searches its entire memory to see if that data word is stored anywhere in it. The entire memory search can typically be completed in one clock cycle, reducing the switch's latency.

A network router, another type of networking devices, often uses ternary CAM for storing its routing table. Each address has two parts: the network prefix, which can vary in size depending on the subnet configuration, and the host address, which occupies the remaining bits. Each subnet has a network mask that specifies which bits of the address are the network prefix and which bits are the host address. Routing is done by consulting the routing table which contains each known destination network prefix, the associated network mask, and the information needed to route packets to that destination. Without CAM, the router compares the destination address of the packet to be routed with each entry in the routing table, performing a logical AND with the network mask and comparing it with the network prefix.

Ternary CAM is a more flexible type of CAM. In addition to is and Os, ternary CAM allows a third matching state of "X" or "don't care" for one or more bits in the stored data word, thus adding flexibility to the search. For example, a ternary CAM device might have a stored word of "10XX0" which will match any of the four search words "10000", "10010", "10100", or "10110". Using a ternary CAM device for the routing table makes the lookup process very efficient. The addresses are stored using "don't care" for the host part of the address, so looking up the destination address in the CAM immediately retrieves the correct routing entry; both the masking and comparison are done by the CAM hardware.

With the advance of networking technology, the capacity of CAM devices installed in networking devices keeps increasing. Modeling a CAM device (TCAM in particular) using programmable logic in a reconfigurable hardware modeling device such as an emulator or a prototyping device can be quite expensive and sometimes impractical. On the other hand, mapping a CAM device using static random access memory (SRAM) resources in a reconfigurable hardware modeling device has serious performance issues (e.g., slow search speed) due to the limited number of read/write ports for a SRAM device. It is desirable to search for a modeling solution that provides fast CAM search operation, satisfies the CAM capacity requirement, and is not too expensive.

BRIEF SUMMARY OF THE DISCLOSED TECHNOLOGY

Aspects of the disclosed technology relate to techniques for modeling content-addressable memory in emulation and prototyping. In one aspect, there is circuit design comprising a model for content-addressable memory, the model for content-addressable memory comprising: memory circuitry, bits in words of the memory circuitry being associated with addresses of the content-addressable memory, and addresses of the memory circuitry being associated with possible values for a whole or segments of a search key used for matching words stored in the content-addressable memory, wherein the model for the content-addressable memory performs a search operation for a key comprising: selecting one or more words stored in the memory circuitry at addresses that are associated with values matching a whole or segments of the key, and wherein the model for the content-addressable memory performs a write operation comprising: changing a particular bit at each of one or more addresses of the memory circuitry to a first specific value or a second specific value, location of the particular bit being associated with a particular address that is provided to the model for the content-addressable memory for writing a particular word, addresses in the one or more addresses of the memory circuitry where the particular bit is changed to the first specific value being associated with a value or values matching a whole or segments of the particular word, addresses in the one or more addresses of the memory circuitry where the particular bit is changed to the second specific value being associated with a value or values not matching a whole or any segment of the particular word.

The memory circuitry may comprise a plurality of memory blocks, addresses of each of the plurality of memory blocks being associated with possible values for one of a plurality of segments of a search key used for matching words stored in the content-addressable memory. The search operation further comprises: combining the one or more words to obtain a result of the search operation.

The model for content-addressable memory may further comprises: state machine circuitry configured to facilitate the search operation. The content-addressable memory may be ternary content-addressable memory.

Additionally or alternatively, the model for content-addressable memory may further comprises: additional memory circuitry, wherein the write operation performed by the model for the content-addressable memory further comprises: writing the particular word to the additional memory circuitry at an address corresponding to the particular address. The model for content-addressable memory may perform a read operation comprising: reading a word from the additional memory circuitry at an address corresponding to a specific address that is provided to the model for the content-addressable memory for the read operation.

The memory circuitry, the additional memory circuitry or both may comprise random-access memory blocks.

In another aspect, there is reconfigurable hardware modeling device programmed to implement a hardware model of a circuit design, the hardware model comprising: memory circuitry, bits in words of the memory circuitry being associated with addresses of the content-addressable memory, and addresses of the memory circuitry being associated with possible values for a whole or segments of a search key used for matching words stored in the content-addressable memory, wherein the hardware model performs a search operation for a key comprising: selecting one or more words stored in the memory circuitry at addresses that are associated with values matching a whole or segments of the key, and wherein the hardware model performs a write operation comprising: changing a particular bit at each of one or more addresses of the memory circuitry to a first specific value or a second specific value, location of the particular bit being associated with a particular address that is provided to the model for the content-addressable memory for writing a particular word, addresses in the one or more addresses of the memory circuitry where the particular bit is changed to the first specific value being associated with a value or values matching a whole or segments of the particular word, addresses in the one or more addresses of the memory circuitry where the particular bit is changed to the second specific value being associated with a value or values not matching a whole or any segment of the particular word.

The hardware model may further comprise additional memory circuitry, wherein the write operation performed by the hardware model further comprises: writing the particular word to the additional memory circuitry at an address corresponding to the particular address.

The reconfigurable hardware modeling device may be a hardware-based emulator or an FPGA prototyping device.

In still another aspect, there is a method, executed by at least one processor of a computer, comprising: identifying a content-addressable memory device in a circuit design; and replacing the content-addressable memory device with a content-addressable memory model to generate a modified circuit design, the content-addressable memory model comprising: memory circuitry, bits in words of the memory circuitry being associated with addresses of the content-addressable memory, and addresses of the memory circuitry being associated with possible values for a whole or segments of a search key used for matching words stored in the content-addressable memory, wherein the content-addressable memory model performs a search operation for a key comprising: selecting one or more words stored in the memory circuitry at addresses that are associated with values matching a whole or segments of the key, and wherein the content-addressable memory model performs a write operation comprising: changing a particular bit at each of one or more addresses of the memory circuitry to a first specific value or a second specific value, location of the particular bit being associated with a particular address that is provided to the model for the content-addressable memory for writing a particular word, addresses in the one or more addresses of the memory circuitry where the particular bit is changed to the first specific value being associated with a value or values matching a whole or segments of the particular word, addresses in the one or more addresses of the memory circuitry where the particular bit is changed to the second specific value being associated with a value or values not matching a whole or any segment of the particular word.

The content-addressable memory model may further comprises: additional memory circuitry, wherein the write operation performed by the content-addressable memory model further comprises: writing the particular word to the additional memory circuitry at an address corresponding to the particular address. The content-addressable memory model may perform a read operation comprising: reading a word from the additional memory circuitry at an address corresponding to a specific address that is provided to the content-addressable memory model for the read operation.

The method may further comprise: compiling the modified circuit design to generate bitstreams for programming a reconfigurable hardware modeling device. The reconfigurable hardware modeling device may be a hardware-based emulator or an FPGA-based prototyping device.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

FIG. 6C shows how a final search result is obtained based on two intermediate results.

DETAILED DESCRIPTION OF THE DISCLOSED TECHNOLOGY

General Considerations

Figure 1A:
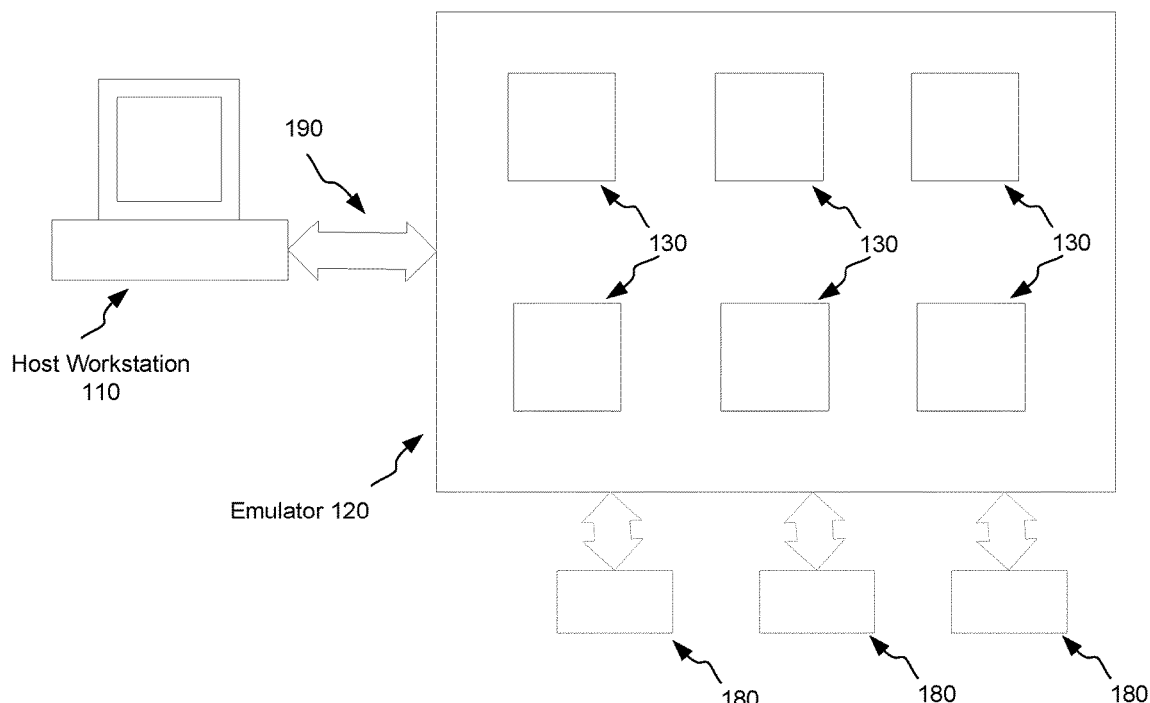
FIG. 1A shows an illustrative example of an emulation system with an emulator being coupled to targets.

Various aspects of the present disclosed technology relate to techniques for modeling content-addressable memory in emulation and prototyping. In the following description, numerous details are set forth for the purpose of explanation. However, one of ordinary skill in the art will realize that the disclosed technology may be practiced without the use of these specific details. In other instances, well-known features have not been described in detail to avoid obscuring the present disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "associate", "send" and "deliver" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Illustrative Hardware Modeling Environment

Reconfigurable hardware modeling devices can be emulators or prototyping devices. Two types of emulators have been developed. The first type is FPGA-based. In an FPGA-based architecture, each FPGA chip has a network of prewired blocks of look-up tables and coupled flip-flops. A look-up table can be programmed to be a Boolean function, and each of the look-up tables can be programmed to connect or bypass the associated flip-flop(s). Look-up tables with connected flip-flops act as finite-state machines, while look-up tables with bypassed flip-flops operate as combinational logic. The look-up tables can be programmed to mimic any combinational logic of a predetermined number of inputs and outputs. To emulate a circuit design, the circuit design is first compiled and mapped to an array of interconnected FPGA chips. The compiler usually needs to partition the circuit design into pieces (sub-circuits) such that each fits into an FPGA chip. The sub-circuits are then synthesized into the look-up tables (that is, generating the contents in the look-up tables such that the look-up tables together produce the function of the sub-circuits). Subsequently, place and route are performed on the FPGA chips in a way that preserves the connectivity in the original circuit design.

The programmable logic chips employed by an emulator may be commercial FPGA chips or custom-designed emulation chips containing programmable logic blocks. A custom FPGA-based emulator can have a specially designed internal interconnection network of programmable elements within each custom FPGA, an external interconnecting network and I/O structure of custom FPGAs, and a design-under-test debug engine. Such architecture enables, compared to a commercial FPGA-based counterpart, fast and correct-by-construction compilation and high design visibility in the silicon fabric that assumes 100% access without probe compilation and rapid waveform tracing. A commercial FPGA chip may have somewhat larger capacity density than a custom FPGA chip. For a given design, a custom FPGA-based emulator may need more FPGAs than a commercial FPGA-based emulator, leading to larger physical dimensions and higher power consumption.

The second type of emulators is processor-based: an array of Boolean processors able to share data with one another is employed to map a circuit design, and Boolean operations are scheduled and performed accordingly. Similar to the FPGA-based, the circuit design needs to be partitioned into sub-circuits first so that the code for each sub-circuit fits the instruction memory of a processor. The compilation speed of a processor-based emulator, however, is much faster than those of a FPGA-based emulator. Drawbacks are limited speed of execution in a transaction-based mode, large power consumption, and large physical dimensions compared to a FPGA-based emulator.

An emulator may operate in various modes. In an in-circuit emulation mode, the emulator is connected with a user's target system to form a prototype of the system the user is designing. The emulator typically replaces the circuit being designed for the target system, allowing system-level and software testing prior to silicon availability. Although an emulator may run up to six orders of magnitude faster than a simulator, it is often not fast enough to run at the same speed of the physical target system (a few megahertz vs hundreds of megahertz). Speed rate adapters may be introduced between the target system and the emulator. A rate adapter behaves like a buffer. It caches the signal activity from the design-under-test (DUT) at emulation speed and sends it at real-time speed to the target system. Conversely, it captures the signal activity from the target system at full speed, caches it, and then sends it back to the DUT at emulation speed. Even when a rate adapter is available, the constant evolution of speed and complexity of individual I/O protocols may make timely rate adapter development difficult.

In an acceleration mode, the physical target system is replaced by a virtual target system modelled via one of the high-level languages such as SystemVerilog, SystemC, or C++. The acceleration mode leverages the existing simulation testbench and removes the need for external rate adapters. The testbench creates test vectors and check corresponding responses of the circuit model. In addition to the elimination of speed adapters, the acceleration mode has advantages such as no hardware dependencies, the ability to use the emulator remotely, and the ability to run verification of corner cases.

The acceleration mode can be cycle-based or transaction-based. The cycle-based acceleration mode employs a signal-level or bit-level interface connecting the testbench processed by the host workstation to the design mode on the emulator. Each and every transition on each and every interface signal must be transferred between the testbench and the design model at the slow speed of the testbench simulated in the workstation. As a result, the speed of the emulator is wasted waiting to carry out these signal transfers.

The transaction-based acceleration reduces the traffic between workstation and emulator by replacing bit-by-bit exchanges with transaction exchanges. Data exchange is through so-called transactors. A transactor, including a front-end proxy interface on the workstation or host computer, a back-end bus-functional model on the emulator and a physical communication channel between the host computer and the emulator, converts high-level commands from the testbench on the host computer into signal-level bit sequences required by the design-under-test model on the emulator, and vice versa. This allows data being streamed and buffered between the testbench and the design-under-test, speeding up the execution of the testbench. A design team can thus access the full performance of the emulator. In addition to performance, the transaction-based emulation eliminates the need for rate adapters. The design-under-test can connect to a "virtual device" (a software model of the device) that runs on the host computer through a transaction-level interface or to a physical device through a transaction-level interface and a "virtual device" acting as a bridging device.

In addition to emulators, reconfigurable hardware modeling devices also include FPGA prototyping devices. FPGA prototyping is typically deployed near the end of the verification process to catch system-level issues. For designs that rely heavily on commercial intellectual property (IP), an FPGA-based prototype is an ideal test platform for ensuring all IP components perform together. An FPGA-based prototype can also serve as a vehicle for software development and validation. Embedded software has become the dominant part of the effort in modern System-on-Chip (SoC) design. FPGA prototyping provides software developers early access to a fully functioning hardware platform well before real silicon. This enables early software development tasks such as operating system (OS) integration and application testing. The increased productivity of software development and validation greatly accelerates a product's time-to-market.

Compared to FPGA-based emulators which typically operate at one to two million cycles per second, FPGA prototypes are designed and built to achieve the highest speed of execution possible, allowing the extension of the speed range into tens of megahertz. The downside to FPGA prototyping is capacity limitations, limited debugging capabilities and long bring-up time. With growing complexity of FPGAs and advancement in both emulation and prototyping technologies, the lines between FPGA-based prototyping and emulation are increasingly blurring.

In some embodiments, the disclosed technology may be implemented as part of a hardware emulation environment, such as the one illustrated in FIG. 1A. As seen in this figure, the hardware emulation environment includes an emulator 120 coupled to a host computer or workstation 110. The workstation 110 may be implemented by one or more computing systems. One computing system may include a single computer or multiple computers (e.g., a master computer and a plurality of slave computers). The workstation provides the capability to load the DUV (design-under-verification, also referred to as DUT—design under test) model into the emulator, controls the execution of the DUT model on the emulator over time, and serves as a debugging interface into the DUV model on the emulator. As discussed previously, the workstation may include the testbench and perhaps other software models in some of the operational modes.

The emulator 120 includes multiple printed circuit boards (emulation circuit boards) 130. These emulation circuit boards 130 are networked (not shown). A circuit design may be partitioned by the workstation 110 and loaded to the emulation circuit boards 130 for emulation.

In the in-circuit emulation mode, one or more targets 180 may be coupled to the emulator 120 as shown in FIG. 1A. In some simple environments, a target may be a piece of test equipment that generates and verifies test data such as a network tester. In other environments, the target can be the actual circuitry with which the DUT model will interact in its final application (e.g., other hardware components of the system for which the DUT model is designed). A target can be either a static target or a dynamic target, depending on whether design clock signals run in the emulator can be suspended or not.

Figure 1B:
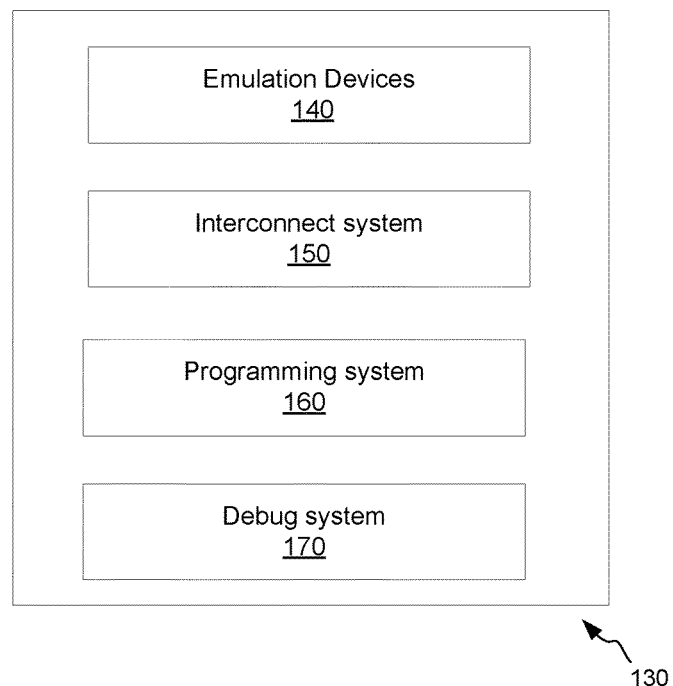
FIG. 1B shows an illustrative example of an emulation circuit board.

FIG. 1B illustrates an example of an emulation circuit board 130. The emulation circuit board 130 includes an array of emulation devices 140. Each of the emulation devices 140 typically includes a plurality of logic modeling blocks and a plurality of memory modeling blocks. It may also include an interconnect system, a programming system, and a debug system, similar to the emulation circuit board 130. The logic modeling blocks use FPGAs or Boolean processors to model general combinatorial logic such as AND, OR, XOR, inversion and more complex functions for multiple inputs. The logic modeling blocks may also provide for the modeling of and/or include sequential components such as flip-flops and/or latches. The memory modeling blocks provide specific resources for modeling memories in circuit designs. While memories, used prevalently in modern digital logic designs, could be modeled with the combinatorial and sequential components in the logic modeling blocks, they can be more efficiently modeled with specific dedicated resources typically containing random-access memory (RAM) blocks and an interface to connect the memory blocks to the logic modeling blocks.

It should be noted that there are no dedicated resources containing native content-addressable memory blocks in conventional emulator systems, commercial FPGA-based, custom FPGA-based, or processor-based.

Also included in the emulation circuit board 130 are a configurable interconnect system 150, a programming system 160, and a debug system 170. A portion of a circuit design on one emulation device may need data computed by another portion of the design on another emulation device. The configurable interconnect system 150 allows data to be moved between emulation devices 140. In some implementations, the configurable interconnect system 150 may include a cross-bar device, a multiplexer, some other configurable network, or any combination thereof.

The programming system 160 enables a variety of other types of data to be brought in or out from an emulation device 140. Examples include programming data to configure an emulation device to perform a particular function, visibility data collected from the debug system 170 to be brought to the host workstation 110 for display, and content data either read from or written to memory circuitry in an emulation device 140.

The debug system 170 enables the emulation system to monitor the behavior of a modeled circuit design. Needed data for visibility viewing purposes can be stored in the debug system 170. The debug system 170 may also provide resources for detecting specific conditions occurring in the circuit design. Such condition detection is sometimes referred to as triggering.

The emulator 120 is coupled to the host workstation 110 through an interface system 190. The interface system 190 comprises one or more interfaces. A typical interface is optimized to transport large amounts of data such as data containing the emulated circuit design model (e.g., FPGA configuration bitstreams), initial contents of registers and design memories and data for debugging purposes. This interface is independent of design-under-test and may comprise dedicated logic or programmed logic in the emulator.

The interface system may also comprise one or more transaction-level interfaces. These interfaces may be optimized for small packets of data and fast streaming speed. The speed may be, for example, in the order of 2-3 Gigabits per second. The communication is performed through transactors as discussed previously. A transactor includes a back-end bus-functional model—instrumented logic in the emulator model, which requires the emulator infrastructure clock keep running even though the design clocks can be stopped.

It should also be appreciated that the emulation system in FIG. 1A and the emulation circuit board 130 in FIG. 1B are illustrated as examples only, and they are not intended to be limiting. Various embodiments of the disclosed technology may be implemented using only a subset of the components illustrated in the figures, or include an alternate combination of components, including components that are not shown in the figures.

Figure 2:
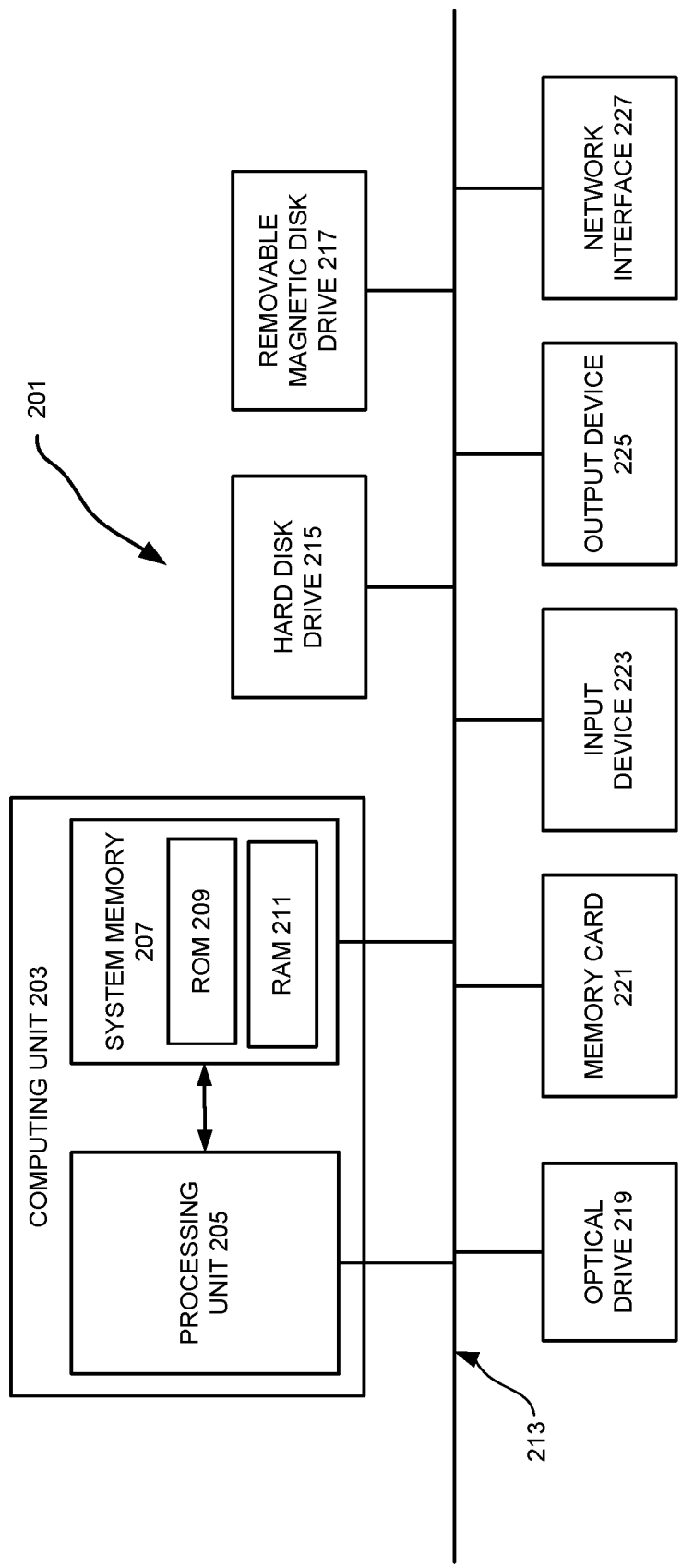
FIG. 2 illustrates a programmable computer system with which various embodiments of the disclosed technology may be employed.

FIG. 2 shows an illustrative example of a computing device 201 that may serve as the workstation 110. As seen in this figure, the computing device 201 includes a computing unit 203 with a processing unit 205 and a system memory 207. The processing unit 205 may be any type of programmable electronic device for executing software instructions, but will conventionally be a microprocessor. The system memory 207 may include both a read-only memory (ROM) 209 and a random access memory (RAM) 211. As will be appreciated by those of ordinary skill in the art, both the read-only memory (ROM) 209 and the random access memory (RAM) 211 may store software instructions for execution by the processing unit 205.

The processing unit 205 and the system memory 207 are connected, either directly or indirectly, through a bus 213 or alternate communication structure, to one or more peripheral devices. For example, the processing unit 205 or the system memory 207 may be directly or indirectly connected to one or more additional memory storage devices, such as a "hard" magnetic disk drive 215, a removable magnetic disk drive 217, an optical disk drive 219, or a flash memory card 221. The processing unit 205 and the system memory 207 also may be directly or indirectly connected to one or more input devices 223 and one or more output devices 225. The input devices 223 may include, for example, a keyboard, a pointing device (such as a mouse, touchpad, stylus, trackball, or joystick), a scanner, a camera, and a microphone. The output devices 225 may include, for example, a monitor display, a printer and speakers. With various examples of the computer 201, one or more of the peripheral devices 215-225 may be internally housed with the computing unit 203. Alternately, one or more of the peripheral devices 215-225 may be external to the housing for the computing unit 103 and connected to the bus 213 through, for example, a Universal Serial Bus (USB) connection.

With some implementations, the computing unit 203 may be directly or indirectly connected to one or more network interfaces 227 for communicating with other devices making up a network. The network interface 227 translates data and control signals from the computing unit 203 into network messages according to one or more communication protocols, such as the transmission control protocol (TCP) and the Internet protocol (IP). Also, the interface 227 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 201 is illustrated as an example only, and is not intended to be limiting. Various embodiments of the disclosed technology may be implemented using one or more computing devices that include the components of the computer 201 illustrated in FIG. 2, which include only a subset of the components illustrated in FIG. 2, or which include an alternate combination of components, including components that are not shown in FIG. 2. For example, various embodiments of the disclosed technology may be implemented using a multi-processor computer, a plurality of single and/or multiprocessor computers arranged into a network, or some combination of both.

Modeling Content-Addressable Memory

Figure 3:
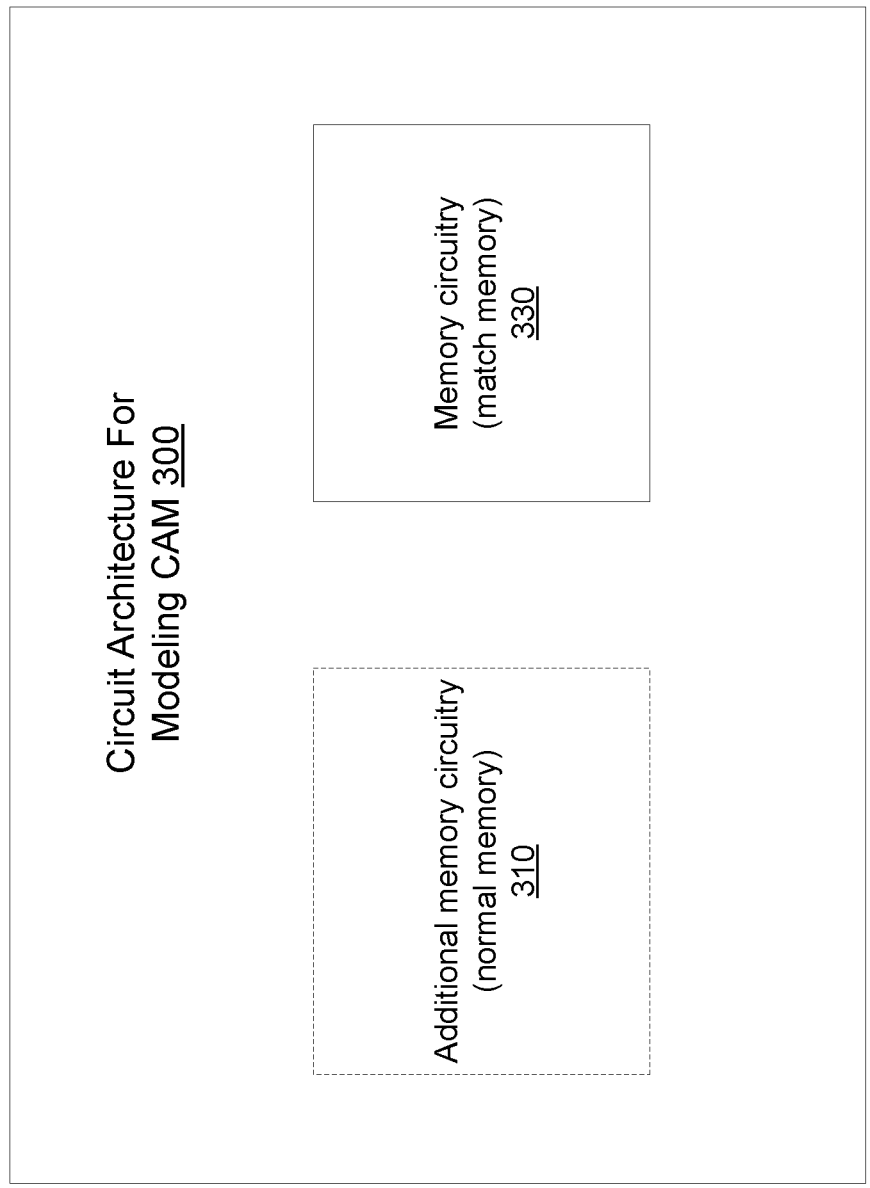
FIG. 3 illustrates an example of a circuit architecture for modeling content-addressable memory that may be employed by various embodiments of the disclosed technology.

FIG. 3 illustrates an example of a circuit architecture 300 for modeling content-addressable memory that may be employed by various embodiments of the disclosed technology. The circuit architecture 300 comprises memory circuitry 330 (also referred to as match memory). In some embodiments of the disclosed technology, the circuit architecture 300 further comprises additional memory circuitry 310 (also referred to as standard memory, regular memory or normal memory). Both the additional memory circuitry 310 and the memory circuitry 330 can be constructed using standard computer memory devices such as random-access memory blocks. However, only the additional memory circuitry 310 is configured to operate as a standard computer memory: in a read operation, the additional memory circuitry 310 returns a data word (a word) stored at a supplied address; and in a write operation, the additional memory circuitry 310 stores a word at a supplied address. The memory circuitry 330 is configured such that bits of a word in the memory circuitry 330 are associated with addresses of the additional memory circuitry 310, and addresses of the memory circuitry 330 are associated with possible values for a whole or segments of a word stored in the additional memory circuitry 310.

A write operation performed by the circuit 300 includes changing a particular bit in each of one or more addresses of the memory circuitry 330 to a first specific value (e.g., "1") or a second specific value (e.g., "0"). The location of this particular bit is associated with a particular address that is provided to the circuit 300 for writing a particular word. The addresses in the one or more addresses of the memory circuitry 330 where the particular bit is changed to the first specific value are associated with a value or values matching a whole or segments of the particular word; and the addresses in the one or more addresses of the memory circuitry 330 where the particular bit is changed to the second specific value are associated with a value or values not matching a whole or any segment of the particular word.

If the circuit 300 contains the additional memory circuitry 310, a write operation will further comprise writing the particular word to the additional memory circuitry at an address corresponding to the particular address. A read operation performed by the circuit 300 can be performed by the additional memory circuitry 310 alone, similar to how a word is read in a standard computer memory.

Due to the write operation, each word stored in the memory circuitry 330 contains the information of which addresses of the additional memory circuitry 310 store words matching or containing a value associated with the address of the memory circuitry 330. In a search operation performed by the circuit 300, therefore, a word stored in the memory circuitry 330 having an address that is associated with a value being the same as the key is selected or words stored in the memory circuitry 330 having addresses that are associated with values matching segments of the key are selected. In the latter case, the memory circuitry may comprise a plurality of memory blocks, addresses of each of the plurality of memory blocks being associated with possible values for one of a plurality of segments of a word for storing in the content-addressable memory and the search operation may further comprise combining the selected words to obtain a result of the search operation. These operations are facilitated by logic circuitry included in the circuit architecture 300. For example, the logic circuitry may include state machine circuitry for the search operation.

It should be appreciated by a person of ordinary skill in the art that the additional memory circuitry 310 is not required for implementing the disclosed technology. If a model for content-addressable memory according to the disclosed technology does not need to perform read operations, for example, the memory circuitry 330 can perform write and search operations without the additional memory circuitry 310. A write operation will comprise: changing a particular bit in each of one or more addresses of the memory circuitry 330 to a specific value if the particular bit has a value different from the specific value, location of the particular bit being associated with a particular address that is provided to the circuit 300 for writing a particular word. Here, each of the one or more addresses of the memory circuitry 330 is associated with a value matching a whole or a segment of the particular word. A search operation will comprise selecting one or more words stored in the memory circuitry 330 at addresses that are associated with values matching a whole or segments of the key. In the case of matching segments of the key, the concatenation of the values matching the segments of the key includes the entire key.

Figure 4:
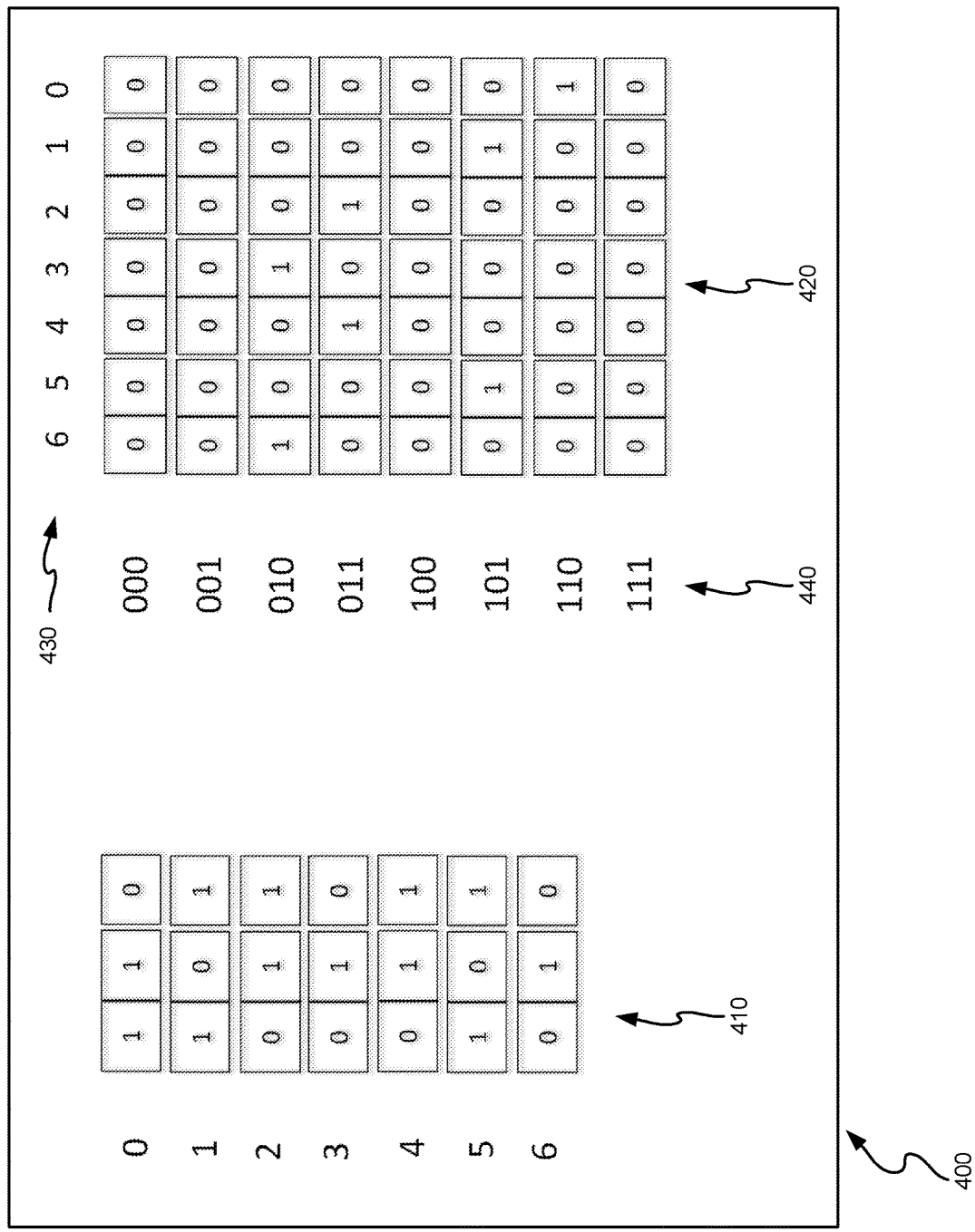
FIG. 4 illustrates an example for how a CAM model operates according to various embodiments of the disclosed technology.

FIG. 4 illustrates an example for how a CAM model 400 operates according to various embodiments of the disclosed technology. In the figure, memory devices 410 and 420 correspond to the additional memory circuitry 310 and the memory circuitry 330, respectively. The memory device 410, operating as a regular memory, has a word width ("W") of 3 and a depth ("D") of 7. The CAM model 400 is binary CAM, and the depth of the memory device 420 is $2^W=2^3=8$. All eight possible words that may be stored in the memory device 410 are associated with addresses of the memory device 420 and listed as a column of values 440 accordingly (in a binary format). Each bit of the memory device 420 is associated with an address of the memory device 410 as indicated by a row of numbers 430 (from 0 to 6).

It should be noted that the word width of the match memory does not have to be equal to the depth of the regular memory. For example, the width of the memory device 420 can be divided into three segments, which can then be stacked vertically into a single memory device. The search operation can select three segments and concatenate them into one word.

The CAM model 400 may be initialized by setting all of the bits to "0". When a word "110" is written to address 0 of the memory device 410, for example, the CAM model 400 sets bit 0 of the memory device 420 at second to the last row to "1" because that row's address is associated with "110". Similarly, when 011 are written to addresses 3 and 5 of the memory device 410, bits 3 and 5 of the memory device 420 at the third row are changed to "1". If a search key "010" is supplied to the CAM model 400, a search result based on the word stored on the third row of the memory device 420 will be outputted.

As the CAM model 400 illustrated, a CAM model based on the disclosed technology can conduct a search operation quickly without performing an address-by-address search. This process can be completed within one clock cycle, similar to a real CAM device. The fast search speed is achieved by storing predetermined search results for all possible keys in a separate memory device (e.g., the memory circuitry 330 in the circuit architecture 300). This may increase the time for the write operation due to the operation of updating the match memory (i.e., the separate memory device) in addition to the conventional writing operation. Overall, it is not too costly however because the write operation is performed less frequently than the search operation in many practical CAM-related applications.

In some embodiments of the disclosed technology, a localized burst write mode may be adopted. In this mode, a write operation is done to the additional memory circuitry 310 while the memory circuitry 330 is not updated immediately if further write operations are localized (e.g., at consecutive ascending/descending addresses). The data for updating can be stored in local registers. Any search operation may trigger the updating operation which is performed before outputting the search result.

Figure 5:
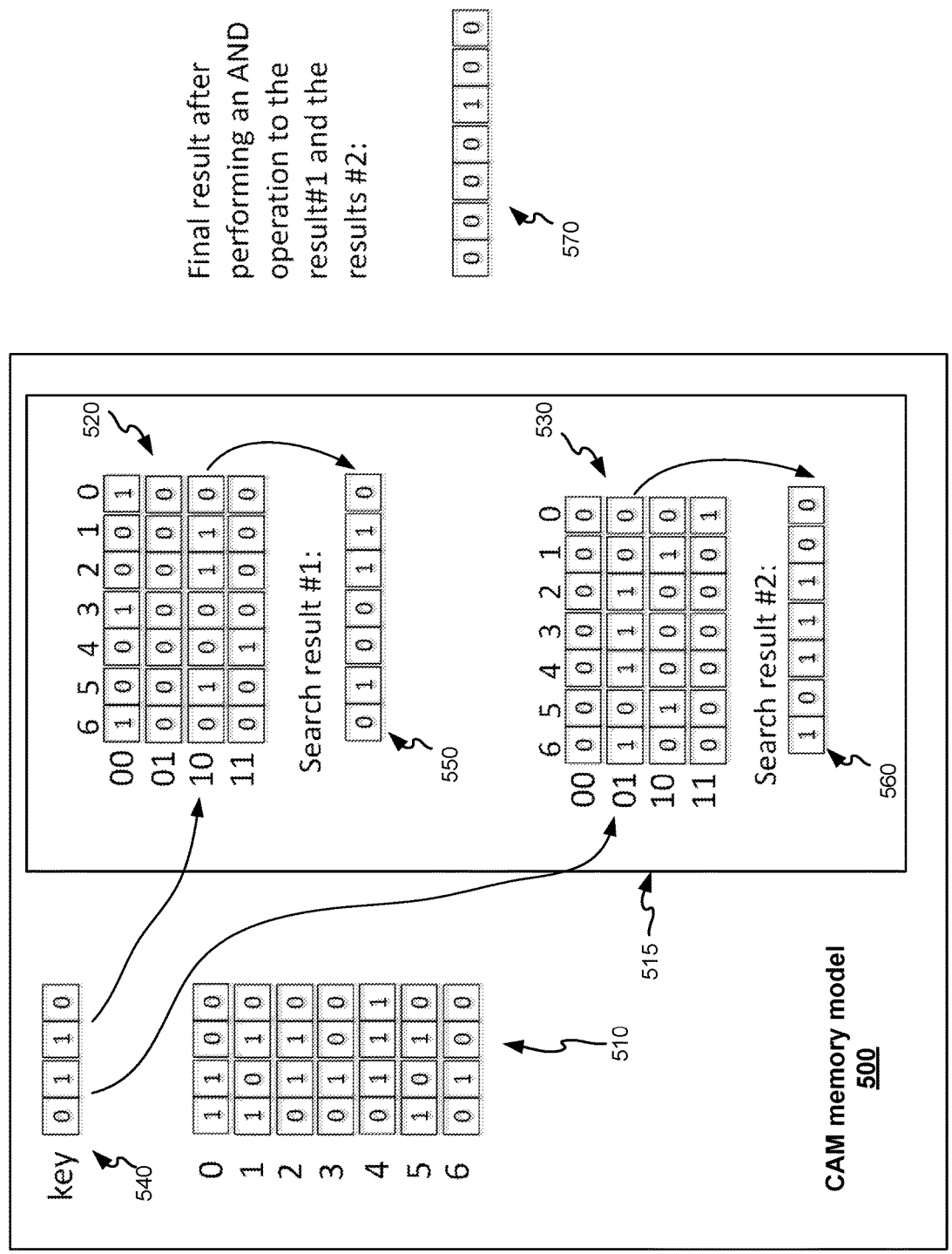
FIG. 5 illustrates an example for how a CAM model in which a match memory device is divided into two memory blocks operates according to various embodiments of the disclosed technology.

FIG. 5 illustrates an example for how a CAM model in which a match memory device is divided into two memory blocks operates according to various embodiments of the disclosed technology. Like the CAM model 400, the CAM model 500 has a regular memory device 510 and a match memory device 515. Unlike the CAM model 400 that contains a single memory block, the CAM model 500 divided the match memory device into two memory blocks 520 and 530. The addresses of the memory block 520 are associated with possible values for the segment of the right two bits of a word stored in the memory device 510, and the addresses of the memory block 530 are associated with possible values for the segment of the left two bits of a word stored in the memory device 510. When a word is written to the CAM model 500, relevant bits in both of the two memory blocks 520 and 530 are updated. A search operation will also select words from both of the two memory blocks 520 and 530. An AND operation may be performed on the two results to obtain a final search result.

FIG. 5 also provides an example of a search operation. A search key 540 is shown to be "0110". As indicated by arrows, the word at the address of the memory block 520 associated with "10" is selected as a first search result 550, while the word at the address of the memory block 530 associated with "01" is selected as a second search result 560. After an AND operation of the first search result 550 and the second search results 560, a final search result 570 is obtained. In the final search result, only bit 2 is "1", indicating the word stored at the address 2 of the memory block 510 matches the key even though there are more matches for the two segments of the key as shown by the first search result 550 and the second search results 560. The final search result 570 can be verified by checking the content of the regular memory device 510.

Dividing the match memory into a plurality of memory blocks significantly reduces the size of the total match memory required. Without the division, the size of the match memory needs to be at least $D*2^W$, where W and D are the width and depth of the regular memory, respectively. If the match memory is divided into n memory blocks, then the minimum size requirement is reduced to $D*n*2^{W/n}$. Assume W=128 (i.e., the search word has 128 bits), the size for using no division needs to be greater than $D*10^{12}$, which is too large for current technology. On the other hand, the size for using 12 memory blocks needs only to be greater than about $D*10^4$, which is manageable.

Figure 6A:
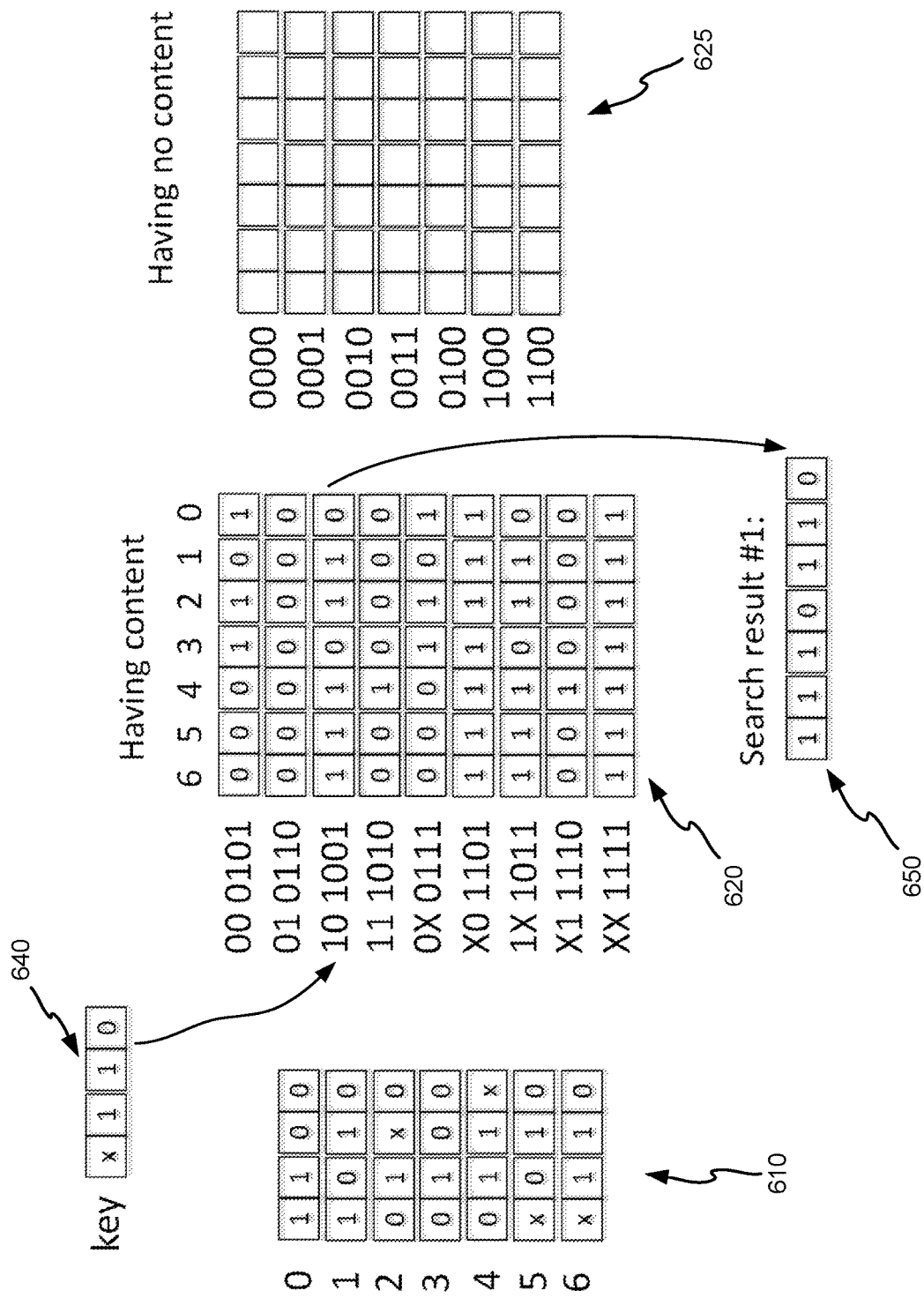
FIG. 6A-6C illustrates an example how a ternary CAM model operates according to various embodiments of the disclosed technology, wherein the ternary CAM model has a match memory device including two memory blocks: one is shown in FIG. 6A and the other is shown in FIG. 6B.
Figure 6B:
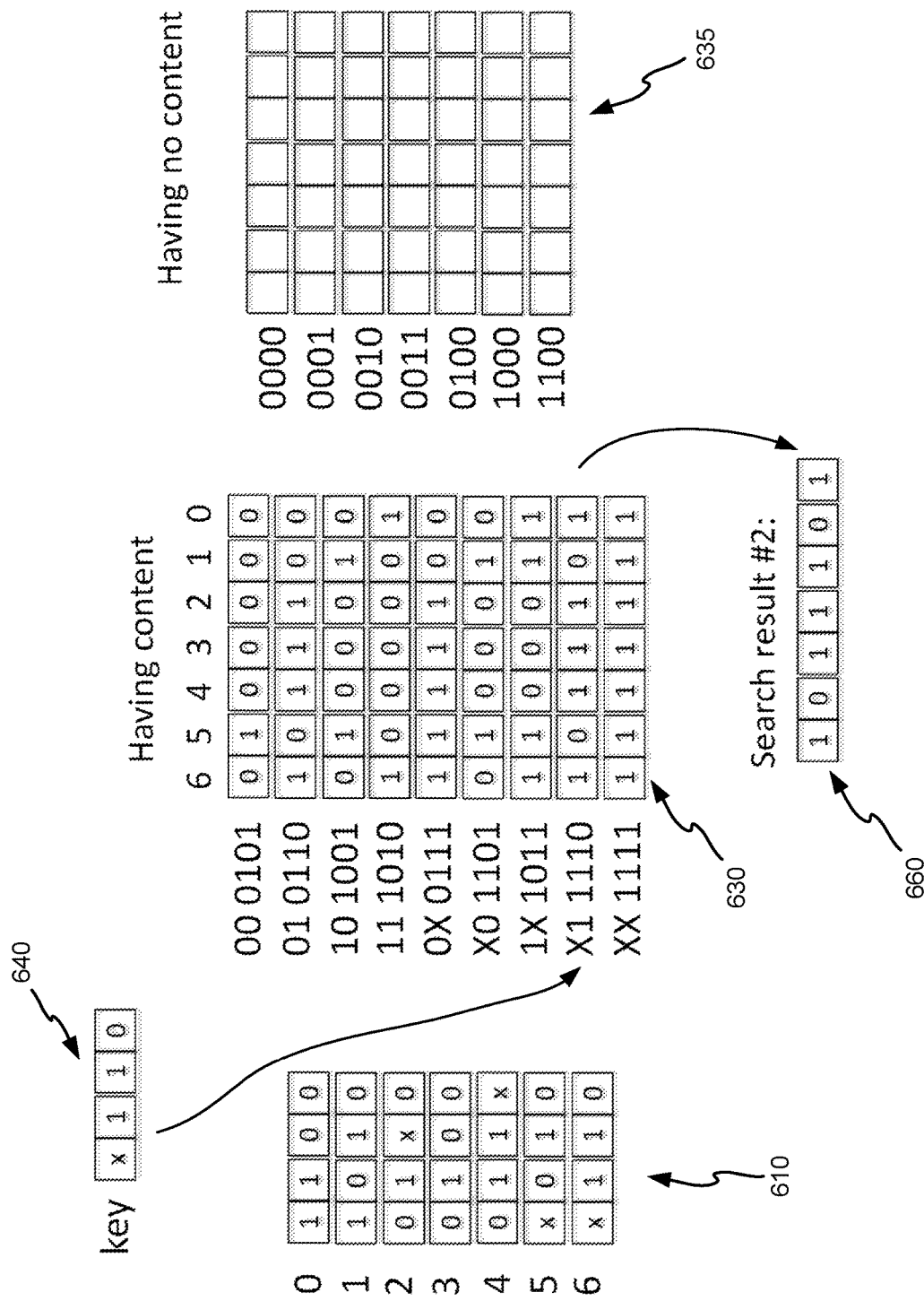
Figure 6C:
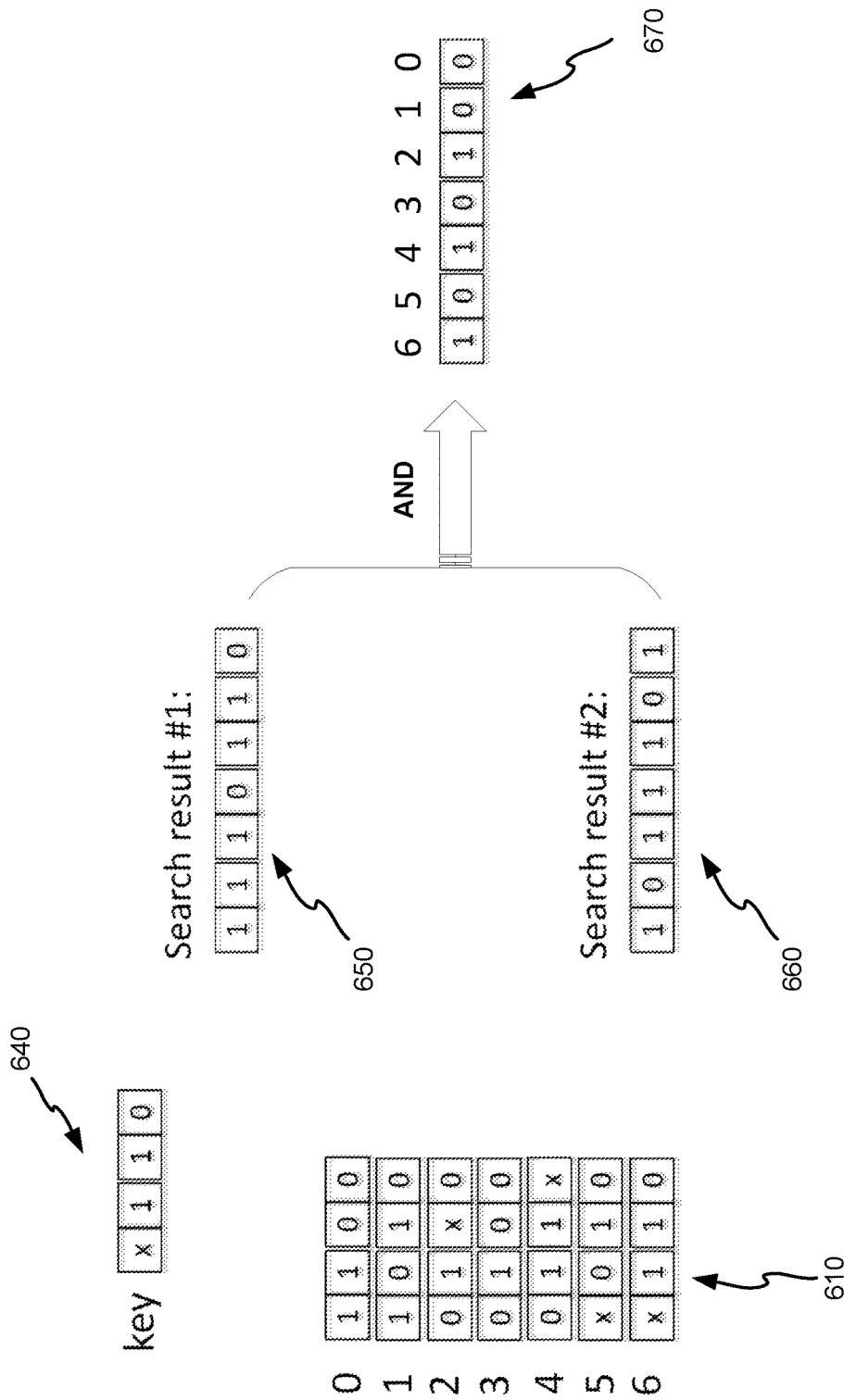

FIGS. 6A-6C illustrates an example for how a ternary CAM model operates according to various embodiments of the disclosed technology. As noted previously, ternary CAM stores an "X" bit in addition to logic "0" and logic "1". The "X" value represents both "0" and 1" and thus allows a wildcard operation—an "X" value matches "0", "1" or "X". In the example shown in FIGS. 6A-6C, the three ternary CAM bit values are encoded as "0"=10, "1"=01, and "X"=11 while "00" represents an invalid value.

The ternary CAM model has a regular memory device 610 shown in each of FIGS. 6A-6C. The ternary CAM model also has a match memory device including two memory blocks: one is shown in FIG. 6A (620) and the other is shown in FIG. 6B (630). Values associated with addresses of the two memory blocks 620 and 630 are shown in both the original form such as "1x" and the encoded form such as "1011". Bits stored in either the regular memory device 610 or the two memory blocks 620 and 630 are shown in the original form only. Tables 625 and 635 show address locations in the memory blocks 620 and 630 which are unused because they correspond to addresses associated with unused values for one or more ternary digits of the key.

A key 640 for a search operation is shown in each of FIGS. 6A-6C. Based on the first segment of the key "10" ("1001" in the encoded form), the third row of the memory block 620 is selected as the first search result 650 as shown by arrows in FIG. 6A; based on the second segment of the key "x1" ("1110" in the encoded form), the eighth row of the memory block 630 is selected as the second search result 660. An AND operation on the two search results 650 and 660 leads to a final search result 670 as shown in FIG. 6C. As the final search result 670 indicates, data words stored at addresses 2, 4 and 6 of the regular memory device 610 match the search key 640.

For ternary CAM, dividing the match memory into a plurality of memory blocks may be even more beneficial in terms of memory size. Without the division, the size of the match memory needs to be at least $D*2^{2*W}$, where W and D are the width and depth of the regular memory, respectively. If the match memory is divided into n memory blocks, then the minimum size requirement is reduced to $D*n*2^{2*W/n}$. Assume W=128 (i.e., the search word has 128 bits), the size for using no division needs to be greater than $D*10^{24}$, which cannot be implemented under current technology. On the other hand, the size for using 12 memory blocks needs only to be greater than about $D*10^8$, which is still manageable.

Figure 7:
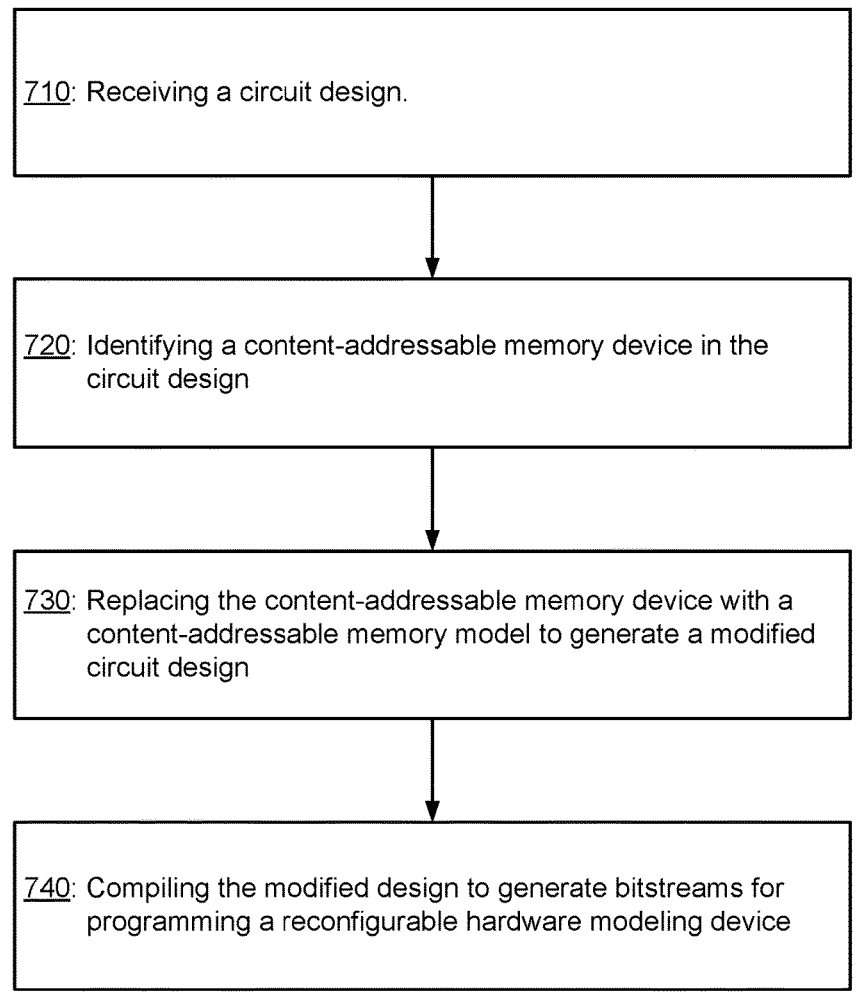
FIG. 7 illustrates a flowchart 700 showing a process of using a CAM model for design verification that may be implemented according to various examples of the disclosed technology.

A reconfigurable hardware modeling device can be programmed to implement a hardware model including a CAM model according to various embodiments of the disclosed technology. FIG. 7 illustrates a flowchart 700 showing a process for modeling content-addressable memory in emulation and prototyping that may be implemented according to various examples of the disclosed technology. For ease of understanding, methods for using a CAM model for design verification that may be employed according to various embodiments of the disclosed technology will be described with reference to the flow chart 700 illustrated in FIG. 7. It should be appreciated, however, that other methods for using a CAM model for design verification may be employed according to various embodiments of the disclosed technology.

In operation 710, a computer receives a circuit design. The circuit design includes one or more CAM devices. The one or more CAM devices may include one or more ternary CAM devices.

In operation 720, the computer identifies the one or more CAM devices in the circuit design. A CAM memory device has various characteristics that may be used for detection. For example, the search operation needs whole memory to be read/compared, and the read/write pattern is similar to normal memory detection.

In operation 730, the computer replaces some or all of the one or more CAM devices with content-addressable memory models designed according to various embodiments of the disclosed technology.

In operation 740, the computer compiles the modified circuit design to generate bitstreams for programming a reconfigurable hardware modeling device. The reconfigurable hardware modeling device may be a hardware-based emulator or an FPGA prototyping device.

Conclusion

While the disclosed technology has been described with respect to specific examples including presently preferred modes of carrying out the disclosed technology, those skilled in the art will appreciate that there are numerous variations and permutations of the above described systems and techniques that fall within the spirit and scope of the disclosed technology as set forth in the appended claims. For example, while specific terminology has been employed above to refer to electronic design automation processes, it should be appreciated that various examples of the disclosed technology may be implemented using any desired combination of electronic design automation processes. Moreover, the disclosed methods, apparatus, and systems are not limited to any specific aspect or feature or combination thereof, nor do the disclosed embodiments require that any one or more specific advantages be present or problems be solved.

What is claimed is:

1. A circuit design comprising a model for content-addressable memory, the model for content-addressable memory comprising:
   memory circuitry, bits in words of the memory circuitry being associated with addresses of the content-addressable memory, and addresses of the memory circuitry being associated with possible values for a whole or segments of a search key used for matching words stored in the content-addressable memory,
      wherein the model for the content-addressable memory performs a search operation for a key comprising: selecting one or more words stored in the memory circuitry at addresses that are associated with values matching a whole or segments of the key, and
      wherein the model for the content-addressable memory performs a write operation comprising: changing a particular bit of a word stored at each of one or more addresses of the memory circuitry to a first specific value or a second specific value, location of the particular bit being associated with a particular address that is provided to the model for the content-addressable memory for writing a particular word, addresses in the one or more addresses of the memory circuitry where the particular bit is changed to the first specific value being associated with a value or values matching a whole or segments of the particular word, addresses in the one or more addresses of the memory circuitry where the particular bit is changed to the second specific value being associated with a value or values not matching a whole or any segment of the particular word.

2. The circuit design recited in claim 1, wherein the memory circuitry comprises a plurality of memory blocks, addresses of each of the plurality of memory blocks being associated with possible values for one of a plurality of segments of a search key used for matching words stored in the content-addressable memory and the search operation further comprises:
   combining the one or more words to obtain a result of the search operation.

3. The circuit design recited in claim 1, wherein the model for content-addressable memory further comprises:
   state machine circuitry configured to facilitate the search operation.

4. The circuit design recited in claim 1, wherein the memory circuitry comprises random-access memory blocks.

5. The circuit design recited in claim 1, wherein the content-addressable memory is ternary content-addressable memory.

6. The circuit design recited in claim 1, further comprising:
   additional memory circuitry, wherein the write operation performed by the model for the content-addressable memory further comprises: writing the particular word to the additional memory circuitry at an address corresponding to the particular address.

7. The circuit design recited in claim 6, wherein the memory circuitry, the additional memory circuitry or both comprise random-access memory blocks.

8. The circuit design recited in claim 6, wherein the content-addressable memory is ternary content-addressable memory.

9. The circuit design recited in claim 6, wherein the model for content-addressable memory performs a read operation comprising: reading a word from the additional memory circuitry at an address corresponding to a specific address that is provided to the model for the content-addressable memory for the read operation.

10. A method, executed by at least one processor of a computer, comprising:
    identifying a content-addressable memory device in a circuit design; and
    replacing the content-addressable memory device with a content-addressable memory model to generate a modified circuit design, the content-addressable memory model comprising:
    memory circuitry, bits in words of the memory circuitry being associated with addresses of the content-addressable memory, and addresses of the memory circuitry being associated with possible values for a whole or segments of a search key used for matching words stored in the content-addressable memory,
       wherein the content-addressable memory model performs a search operation for a key comprising: selecting one or more words stored in the memory circuitry at addresses that are associated with values matching a whole or segments of the key, and
       wherein the model for the content-addressable memory performs a write operation comprising: changing a particular bit of a word stored at each of one or more addresses of the memory circuitry to a first specific value or a second specific value, location of the particular bit being associated with a particular address that is provided to the model for the content-addressable memory for writing a particular word, addresses in the one or more addresses of the memory circuitry where the particular bit is changed to the first specific value being associated with a value or values matching a whole or segments of the particular word, addresses in the one or more addresses of the memory circuitry where the particular bit is changed to the second specific value being associated with a value or values not matching a whole or any segment of the particular word.

11. The method recited in claim 10, wherein the memory circuitry comprises a plurality of memory blocks, addresses of each of the plurality of memory blocks being associated with possible values for one of a plurality of segments of a search key used for matching words stored in the content-addressable memory and the search operation further comprises:
    combining the one or more words to obtain a result of the search operation.

12. The method recited in claim 10, further comprising:
    compiling the modified circuit design to generate bitstreams for programming a reconfigurable hardware modeling device.

13. The method recited in claim 12, wherein the reconfigurable hardware modeling device is a hardware-based emulator or an FPGA-based prototyping device.

14. The method recited in claim 10, wherein the content-addressable memory model further comprises:
    state machine circuitry configured to facilitate the search operation.

15. The method recited in claim 10, wherein the memory circuitry comprises random-access memory blocks.

16. The method recited in claim 10, wherein the content-addressable memory is ternary content-addressable memory.

17. The method recited in claim 10, wherein the content-addressable memory model further comprises:
additional memory circuitry, wherein the write operation performed by the content-addressable memory model further comprises: writing the particular word to the additional memory circuitry at an address corresponding to the particular address.

18. The method recited in claim 17, wherein the memory circuitry, the additional memory circuitry or both comprise random-access memory blocks.

19. The method recited in claim 17, wherein the content-addressable memory is ternary content-addressable memory.

20. The method recited in claim 17, wherein the content-addressable memory model performs a read operation comprising: reading a word from the additional memory circuitry at an address corresponding to a specific address that is provided to the content-addressable memory model for the read operation.

21. A reconfigurable hardware modeling device programmed to implement a hardware model of a circuit design, the hardware model comprising:
memory circuitry, bits in words of the memory circuitry being associated with addresses of the content-addressable memory, and addresses of the memory circuitry being associated with possible values for a whole or segments of a search key used for matching words stored in the content-addressable memory,
wherein the hardware model performs a search operation for a key comprising: selecting one or more words stored in the memory circuitry at addresses that are associated with values matching a whole or segments of the key, and
wherein the model for the content-addressable memory performs a write operation comprising: changing a particular bit of a word stored at each of one or more addresses of the memory circuitry to a first specific value or a second specific value, location of the particular bit being associated with a particular address that is provided to the model for the content-addressable memory for writing a particular word, addresses in the one or more addresses of the memory circuitry where the particular bit is changed to the first specific value being associated with a value or values matching a whole or segments of the particular word, addresses in the one or more addresses of the memory circuitry where the particular bit is changed to the second specific value being associated with a value or values not matching a whole or any segment of the particular word.

22. The reconfigurable hardware modeling device recited in claim 21, wherein the memory circuitry comprises a plurality of memory blocks, addresses of each of the plurality of memory blocks being associated with possible values for one of a plurality of segments of a search key used for matching words stored in the content-addressable memory and the search operation further comprises:
combining the one or more words to obtain a result of the search operation.

23. The reconfigurable hardware modeling device recited in claim 21, wherein the hardware model further comprises:
state machine circuitry configured to facilitate the search operation.

24. The reconfigurable hardware modeling device recited in claim 21, wherein the memory circuitry comprises random-access memory blocks.

25. The reconfigurable hardware modeling device recited in claim 21, wherein the content-addressable memory is ternary content-addressable memory.

26. The reconfigurable hardware modeling device recited in claim 21, wherein the hardware model further comprises:
additional memory circuitry, wherein the write operation performed by the hardware model further comprises: writing the particular word to the additional memory circuitry at an address corresponding to the particular address.

27. The reconfigurable hardware modeling device recited in claim 26, wherein the memory circuitry, the additional memory circuitry or both comprise random-access memory blocks.

28. The reconfigurable hardware modeling device recited in claim 26, wherein the content-addressable memory is ternary content-addressable memory.

29. The reconfigurable hardware modeling device recited in claim 26, wherein the hardware model performs a read operation comprising: reading a word from the additional memory circuitry at an address corresponding to a specific address that is provided to the hardware model for the read operation.

30. The reconfigurable hardware modeling device recited in claim 21, wherein the reconfigurable hardware modeling device is a hardware-based emulator or an FPGA prototyping device.

* * * * *